United States Patent [19]

Poteet et al.

[11] Patent Number: 5,532,966
[45] Date of Patent: Jul. 2, 1996

[54] RANDOM ACCESS MEMORY REDUNDANCY CIRCUIT EMPLOYING FUSIBLE LINKS

[75] Inventors: Kenneth A. Poteet, San Jose; Chitranjan N. Reddy, Milpitas, both of Calif.

[73] Assignee: Alliance Semiconductor Corporation, San Jose, Calif.

[21] Appl. No.: 490,196

[22] Filed: Jun. 13, 1995

[51] Int. Cl.$^6$ .............................. G11C 7/00; G11C 29/00
[52] U.S. Cl. .......................... 365/200; 365/51; 365/225.7
[58] Field of Search ................................. 365/200, 225.7, 365/51, 63, 96, 230.03

[56] References Cited

U.S. PATENT DOCUMENTS

| | | | |
|---|---|---|---|
| 4,228,528 | 10/1980 | Cenker et al. | 365/200 |
| 5,270,976 | 12/1993 | Tran | 365/200 |
| 5,323,348 | 6/1994 | Mori | 365/200 |
| 5,377,146 | 12/1994 | Reddy et al. | 365/200 |
| 5,430,679 | 7/1995 | Hiltebeitel | 365/200 |

Primary Examiner—David C. Nelms
Assistant Examiner—Son Mai
Attorney, Agent, or Firm—Bradley T. Sako

[57] ABSTRACT

A semiconductor random access memory (RAM) is disclosed having a number of array blocks (14), each array block (14) including standard rows, standard columns, redundant rows (24) and redundant columns (26). A row redundancy circuit (44) is provided for each array block that includes a single row fuse bank (28). Within the row fuse bank (28) are row disable fuses (42) and redundant row fuses (54) interspersed at regular intervals between the row disable fuses (42). Each row disable fuse (42) disables a standard row segment (32) when opened. A redundant row segment (46) is driven according to the combination of opened redundant row fuses (54). A column redundancy circuit (62) includes a number of column fuses (64) disposed in a column fuse bank (30). Redundant columns (26) are enabled by opening selected ones of the column fuses (64). If a redundant column (26) is driven the remaining standard columns of its associated array block (14) are disabled. Column fuse banks (30) are commonly aligned with row fuse banks (28) along fuse axes (16 and 18).

20 Claims, 3 Drawing Sheets

RANDOM ACCESS MEMORY REDUNDANCY CIRCUIT EMPLOYING FUSIBLE LINKS

TECHNICAL FIELD

The present invention relates generally to high density, semiconductor random access memories (RAMs), and more particularly to RAM redundancy circuits that employ fusible links to replace defective memory cells with redundant memory cells.

BACKGROUND OF THE INVENTION

The increasing size, density, and complexity of random access memories (RAMs) makes it extremely difficult to fabricate a RAM that is entirely free of defects. RAM defects can be reduced by improved fabrication methods and increased process controls but such approaches have practical limitations. Overly complex fabrication methods can increase costs due to specialized equipment and materials. Process controls cannot entirely eliminate defects because of the many uncontrollable elements involved in fabricating semiconductor devices.

An alternate approach to increasing the yield of a semiconductor memory device is by circuit designs that can compensate for manufacturing defects. One such approach is the use of redundancy schemes in RAMs. RAM redundancy schemes are well known in the art, and typically involve manufacturing a number of redundant memory cells in addition to the "standard" memory cells. The device is tested after fabrication and if defective standard cells are detected, they are replaced by the redundant cells.

Commonly-owned U.S. Pat. No. 5,377,146 entitled HIERARCHICAL REDUNDANCY SCHEME FOR HIGH DENSITY MONOLITHIC MEMORIES and filed on Jul. 23, 1993, discloses a redundancy scheme wherein a RAM includes standard blocks of memory cells with redundant columns and rows, as well as redundant blocks of memory having their own built-in redundancy. Additional redundancy is provided by subdividing the redundant blocks into redundant groups of rows and columns.

Implementing redundancy schemes requires two general steps. First, defective cells must be disabled. Second, the replacement redundant cells must be enabled. While a number of methods for implementing redundancy schemes exist in the prior art, such as "antifuses," non-volatile memories, programmable logic, and current fuses, these methods involve either complex processing steps, complex additional circuitry, or lack reliability. For simplicity and reliability, laser fusible links remain a popular choice. As is well known in the art, laser fusible links are typically composed of polysilicon and covered by a uniform layer of dielectric, such as silicon dioxide. A laser is employed to evaporate a portion of the link to create an electrical open.

Prior art redundancy schemes employing laser fusible links are known to use two sets of fusible links. The first set of links are "disable" fuses which are used to disable a row and/or column of standard cells. The second set of fusible links are "enable" fuses, and are used to enable a row and/or a column of redundant cells to replace the disabled standard cells. These two sets of fuses are provided in two different "fuse banks". Each fuse bank is an alignment of its respective fuses, usually with a minimum pitch and uniform dielectric covering. Sufficient area is provided around the fuse banks to ensure that no peripheral devices or interconnects can be damaged by the laser during repair. In order to reduce the amount of logic or interconnect necessary to implement such a redundancy scheme the fuses are often integrated into critical decoder or row/column driver paths. A drawback to this type of arrangement is that the fuses must be situated proximate their respective rows or columns. While there may be sufficient area for a bank of disable fuses adjacent to an array, a bank of enable fuses must occupy areas in the central portion of the die that are critically needed for decoder and interconnect circuits. To address this problem it is known in the prior art to position fuse banks on the periphery of the die. While providing more central area on the die, such an arrangement requires an additional interconnect scheme to integrate the fuses with the remainder of the redundancy circuits. This adds size and complexity to the redundancy scheme.

A second type of prior art redundancy scheme utilizes only one bank of fuses for a given set of columns or rows. Like the first type of scheme described above, a selected fuse or a selection of fuses are opened to disable a defective row or column. Unlike the previous redundancy scheme, the opened fuse(s) automatically enables a replacement redundant row or column. While requiring fewer fuses to implement, this second scheme requires more logic and can be less flexible than the two fuse bank redundancy scheme mentioned above.

Another drawback of prior art redundancy schemes is that the fuse layouts are not always conducive to rapid repair. It is known in the prior art to orient a "column" fuse bank perpendicular to the columns of an array, and a "row" fuse bank perpendicular to the rows of the array. As a result, the fuse banks for row redundancy are perpendicular to fuse banks for column redundancy, requiring the laser repair apparatus to step across two directions. In the event the device includes multiple arrays, a number of multiple passes in differing directions are required to effectuate laser repair.

It is always desirable to provide a redundancy scheme of reduced die area. It is also desirable to provide a redundancy scheme that overcomes the drawbacks of the prior art by providing a redundancy scheme employing laser fusible links that can be quickly implemented without requiring undue interconnect arrangements and/or additional logic.

SUMMARY OF THE INVENTION

It is an object of the present invention to provide a RAM redundancy circuit employing laser fusible links that does not require a complex interconnect scheme.

It is yet another object of the present invention to provide a RAM redundancy circuit employing laser fusible links that does not occupy a large amount of die area.

It is yet another object of the present invention to provide a RAM o redundancy circuit employing laser fusible links that provides a fuse layout that is advantageous for laser repair.

It is yet another object of the present invention to provide a RAM redundancy circuit employing laser fusible links that requires less critical central die area.

According to the present invention a random access memory (RAM) includes a number of memory blocks, each having standard rows, redundant rows, and a row redundancy circuit. The standard and redundant rows of each memory block are divided into row segments of four rows. The redundancy circuit includes a row disable fuse for each row segment. If the row disable fuse is opened its associated row segment is disabled. In addition to the row disable fuses, redundant row fuses are provided to enable a redundant row segment according to the combination of redundant row fuses that are opened. The row disable fuses and redundant row fuses are situated in a single row fuse bank, adjacent to the memory block and generally perpendicular to the standard rows. All the fuses of the row fuse bank are positioned with even pitch with the redundant row fuses being periodically situated between the row disable fuses. The fuse banks of adjacent memory blocks are aligned along a common axis allowing for laser repair of the adjacent memory blocks with a single pass of the laser. The incorporation of redundant row fuses and row disable fuses in a single fuse bank reduces the need for two fuse banks.

According one aspect of the present invention, each memory block further includes standard columns arranged in standard column segments, redundant columns arranged in redundant column segments, and a column o redundancy circuit. The column redundancy circuit includes a column fuse bank having a number of column fuses. Unlike the row redundancy circuit, the column redundancy circuit includes disable logic so that as a redundant column segment is accessed during operation, all of the standard column segments are disabled. The column fuse banks are aligned along the same common axis as the row fuse banks, and are situated intermediate to adjacent row fuse banks.

According to another aspect of the invention, memory blocks are arranged in corearrays of four memory blocks in a mirror image arrangement so that all fuses for the entire device are aligned along two parallel axes. Multiple core arrays can be combined for larger memory sizes.

Other objects and advantages of the invention will become apparent in light of the following description thereof.

DETAILED DESCRIPTION OF THE EMBODIMENTS

Figure 1:
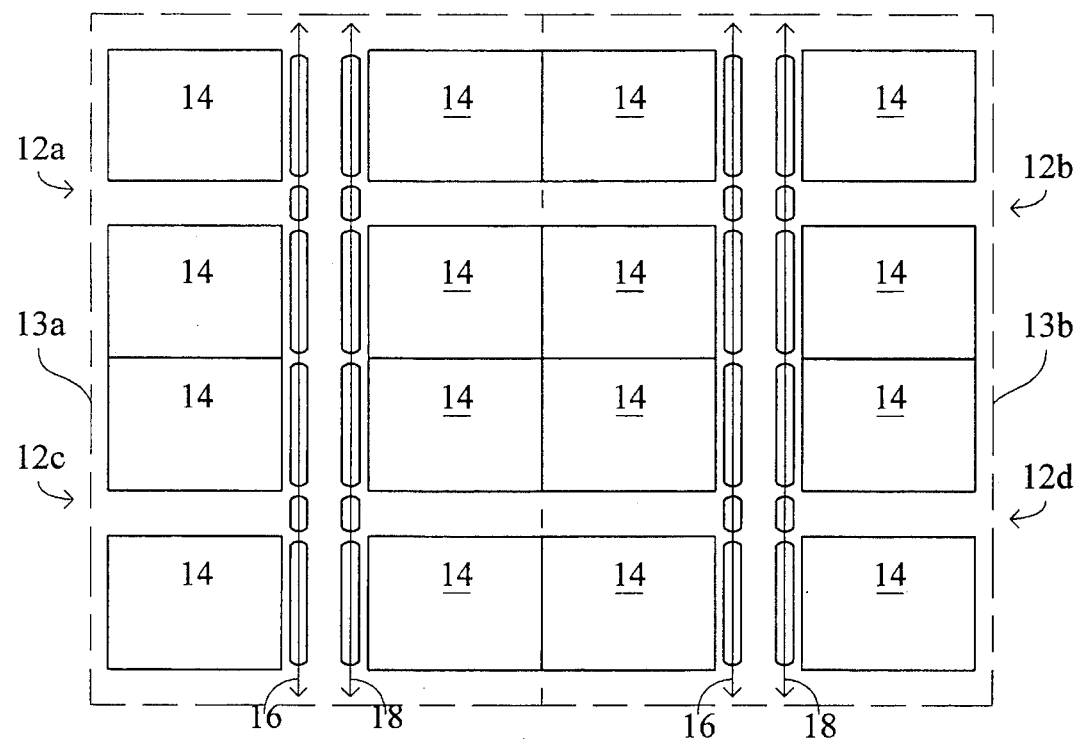
FIG. 1 is a block diagram illustrating the layout of a preferred embodiment of the present invention.

FIG. 1 illustrates, generally, a block diagram of a RAM according to a preferred embodiment of the present invention. The RAM is designated by the general reference character 10 and is shown to include four corearrays (12a–12d). The corearrays 12 can be conceptualized as being aligned in two corearray columns 13a and 13b. The first corearray column 13a is composed of corearrays 12a and 12c and the second corearray column 13b is composed of corearrays 12b and 12d. The four corearrays 12 each consist of a four-by-four rectangular array of array blocks 14.

Situated between the array blocks 14 of each corearray column (13a and 13b) are a first fuse axis 16 and a second fuse axis 18. As will be discussed herein, in a preferred embodiment, all the fuses for the entire RAM are aligned along these axes (16 and 18). It should be noted that while the embodiment described herein is described as a RAM 10, this includes but is not limited to, dynamic RAMs, static RAMs and electrically programmable read only memories (EPROMs).

Figure 2:
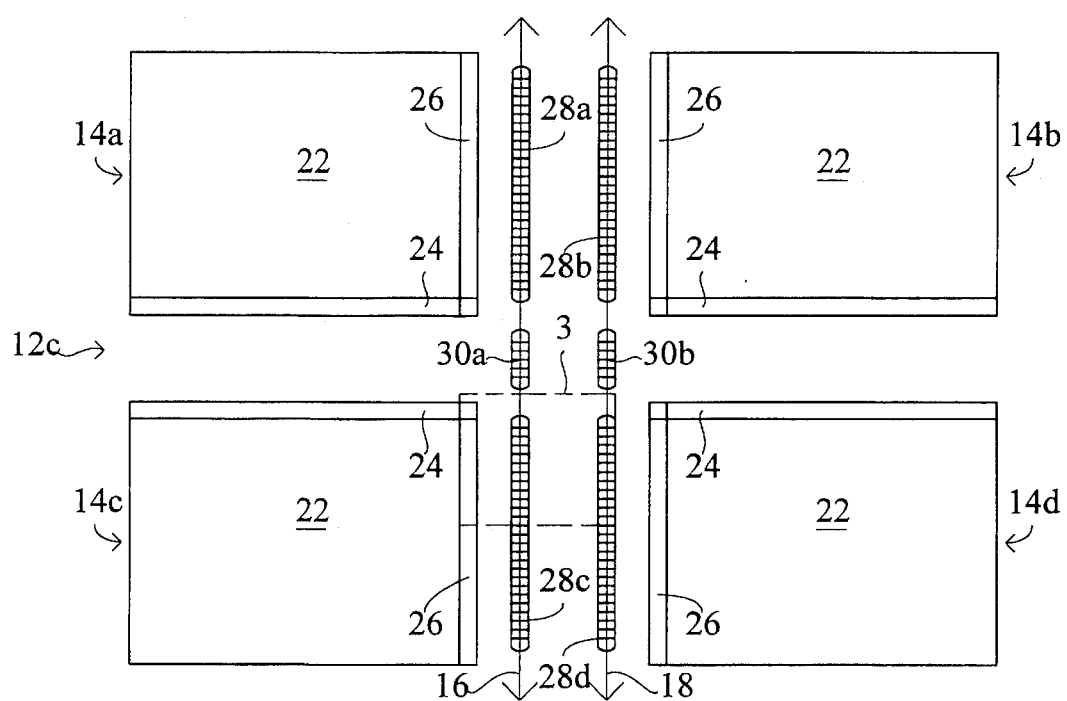
FIG. 2 is a block diagram illustrating the layout of a corearray of a preferred embodiment of the present invention.

FIG. 2 illustrates, generally, a block diagram of a corearray 12 according to a preferred embodiment of the present invention. Each of array blocks 14 of the corearray 12 is shown to include a "standard" portion 22 of standard memory cells arranged in standard rows and standard columns. In addition, each array block also includes redundant rows 24 and redundant columns 26. Centrally disposed within the corearray 12 are four row fuse banks 28a–28d, and two column fuse banks 30a and 30b. As illustrated in FIG. 2, row fuse banks 28a–28d correspond to array blocks 14a14d, respectively. Row fuse banks 28a and 28c are aligned along the first fuse axis 16 and row fuse banks 28b and 28d are aligned along the second fuse axis 18. The column fuse banks 30a and 30b are also aligned along the two fuse axes (16 and 18). Column fuse bank 30a is aligned along the first fuse axis 16 between row fuse banks 28a and 28c. In a mirror image fashion, column fuse bank 30b is aligned along the second fuse axis 18, between row fuse banks 28b and 28d. In this manner all of the fuses for corearray redundancy are provided along the two fuse axes (16 and 18) centrally disposed within the corearray 12.

Referring once again to FIG. 2, a rectangular portion of the corearray 12 is designated by the character 3. This portion is reproduced in greater detail in FIG. 3.

Figure 3:
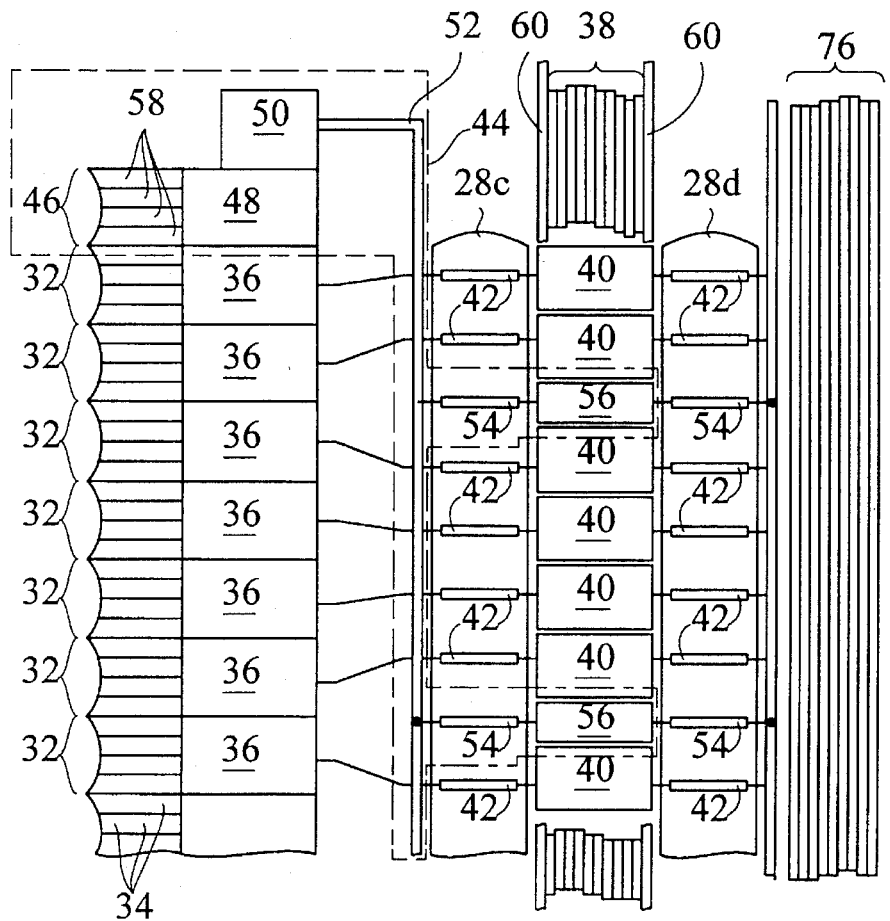
FIG. 3 is a block diagram illustrating the layout of the row redundancy circuit of a preferred embodiment of the present invention.

Referring now to FIG. 3, the array block 14c is shown to include a number of standard row segments 32, each composed of a number of standard rows 34. In the embodiment of FIG. 3, each standard row segment 32 consists of four standard rows 34. Each standard row segment 32 is commonly driven by a standard row driver 36. Row driver circuits are well known in the art and so will not be discussed in detail herein. The standard row drivers 36 are each coupled to a standard row decoder 40 by a row disable fuse 42 situated within the row fuse bank 28c. The standard row decoders 40 are disposed below a number of row decoder lines 38 represented in a cut away view in FIG. 3. It is understood that in the embodiment illustrated, the row decoder lines 38 extend over all of the standard row decoders 40 with each standard row decoder 40 being coupled to selected ones of the row decoder lines 38. According to well understood principles, a row address carried by the row decoder lines 38 is detected by one of the standard row decoders 40 and a corresponding standard row driver 36 is driven via the row disable fuse 42. In the event a standard row 34 is defective and must be replaced, the entire row segment 32 containing the defective standard row 34 is disabled by opening the row disable fuse 42 of its associated row driver 36. Once a standard row segment 32 has been disabled it is replaced by the operation of a row segment 32 has been disabled it is replaced by the operation of a row redundancy circuit 44.

The row redundancy circuit 44 according to the present invention is illustrated in FIG. 3 and is shown to include a redundant row segment 46, a redundant row driver 48, redundant row logic 50, a row fuse summing node 52, a number of redundant row fuses 54, and a redundant row decode circuit 56 corresponding to each redundant row fuse 54. In the embodiment illustrated in FIG. 3, the redundant row segment 46 consists of four redundant rows 58 but is otherwise similar to a standard row segment 32. In a like manner, the redundant row driver 48 is similar to the standard row drivers 36 and commonly drives the redundant rows 58 of the redundant row segment 46.

Unlike the standard row drivers 36 which are each activated by a standard row decoder 40, the redundant row driver 48 is activated by the redundant row logic 50. The redundant row logic 50 drives the redundant row driver 48 according to the logic level of the row fuse summing node 52. In the embodiment of FIG. 3 the row fuse summing node 52 is a metallization line, perpendicular to the standard rows 34 that is situated between the row fuse bank 28c and the standard row drivers 36. The row fuse summing node 52 extends over the connections between the row disable fuses 42 and the standard row drivers 36, and is coupled to each redundant row decode circuit 56 by a redundant row fuse 54. It is understood that while FIG. 3 sets forth only two redundant row fuses 54 and seven row disable fuses 42, the row fuse bank 28c includes a row disable fuses 54 for each standard row segment 32 in the entire array block 14c as well as a number of redundant row fuses 54 equivalent to the number of row decoder lines 38. Each redundant row fuse 54 is connected to one row decoder line 38 by its associated redundant row decode circuit 56. In the embodiment of FIG. 3, the redundant row decoder circuit 56 is a o fuse gate 58 which couples the redundant row fuse 54 to a first supply 60. The first supply 60 is maintained at a first logic level. In the embodiment of FIG. 3, the first supply 60 is a metallization line running adjacent to, and parallel with the row decode lines 38. It is understood that the first supply 60 is connected to power circuits at another location on the RAM 10 which maintain the first supply 60 at a low logic level.

Figure 4:
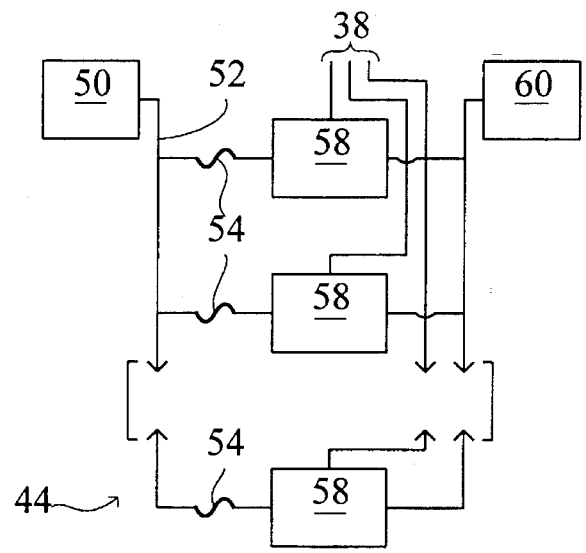
FIG. 4 is a block schematic diagram illustrating the row redundancy circuit of a preferred embodiment of the present invention.

The operation of the embodiment set forth in FIG. 3 is best understood by referring to FIG. 4. FIG. 4 is a block schematic diagram illustrating the operation of the row redundancy circuit 44. During operation of the RAM 10, before a row is to be driven, the redundant row logic 50 precharges the row fuse summing node 52 high. When the row is driven it is addressed by selected ones of the row decode lines 38 being active. This turns on corresponding fuse gates 58, pulling the row fuse summing node 52 from a high logic state to the low logic state of first supply 60. Thus, if all of the redundant row fuses 54 are in tact, one of the fuse gates 58 will always be on and the redundant row summing node 52 will be low. If the row fuse summing node 52 is low when the rows are to be driven, the redundant row segment 46 remains low (disabled). Conversely, if the row fuse summing node 52 is high when the rows are to be driven, the redundant row logic 50 provides an input signal to the redundant row driver 48 and drives the redundant row segment 46 high. Accordingly, if a selected combination of the redundant row fuses 54 is opened, the fuse gates 58 corresponding to the opened redundant row fuses 54 will be disabled. If the combination of active row decoder lines 38 (determined by the row address) corresponds to the combination of disabled fuse gates 58, the row fuse summing node 52 will remain precharged high and the redundant row segment 46 will be driven high. In this manner the redundant rows 46 are enabled.

It is understood that in the embodiment set forth in FIG. 3, each standard row decoder 40 is connected to opposing row drivers 36 of opposing array blocks 14 by way of two row disable fuses 42. In a like manner, in the same embodiment each redundant row decoder 56 is connected to opposing fuse summing nodes 52. Accordingly, referring once again to FIG. 2, each standard row decoder situated between array blocks 14a and 14b will drive standard row drivers in both array blocks (14a and 14b). Similarly, each standard row decoders situated between array blocks 14c and 14d will drive a standard row driver in both array blocks (14c and 14d).

Referring once again to FIG. 3, it is shown that the redundant row fuses 54 are interspersed among the row disable fuses 42. All of the fuses (42 and 54) are laid out with same pitch within the row fuse bank 28c. The redundant row fuses 54 are positioned at regular intervals between row disable fuses 42. This fuse arrangement takes advantage of the area provided between row disable fuses 42. By merging the redundant row fuses 54 with the row disable fuses 42 in a single row fuse bank 28c, the necessity of a separate bank for redundant row fuses is eliminated. This avoids having to provide critical area between array blocks for fuse bank of redundant row fuses, or the complex interconnect necessary when a fuse bank of redundant row fuses is situated on the periphery of the RAM die. It is understood that each row fuse bank 28 of the RAM 10 illustrated in FIG. 1, includes the above arrangement of redundant row fuses 54 interspersed with row disable fuses 42.

One skilled the art would recognize that a number of different arrangements integrating the redundant row fuses and row disable fuses in a single row fuse bank may be arrived at. Accordingly, the particular arrangement set forth in FIG. 3 should not be construed as limiting.

As described previously, in a preferred embodiment each corearray 12 includes two column fuse banks 30a and 30b, with each column fuse bank 30 aligned between two row fuse banks 28. Unlike the row fuse banks 28 where each row fuse bank 28 is employed to provide row redundancy to a single array block 14, the two column fuse banks (30a and 30b) are combined to establish the column redundancy for the entire corearray 12.

Figure 5:
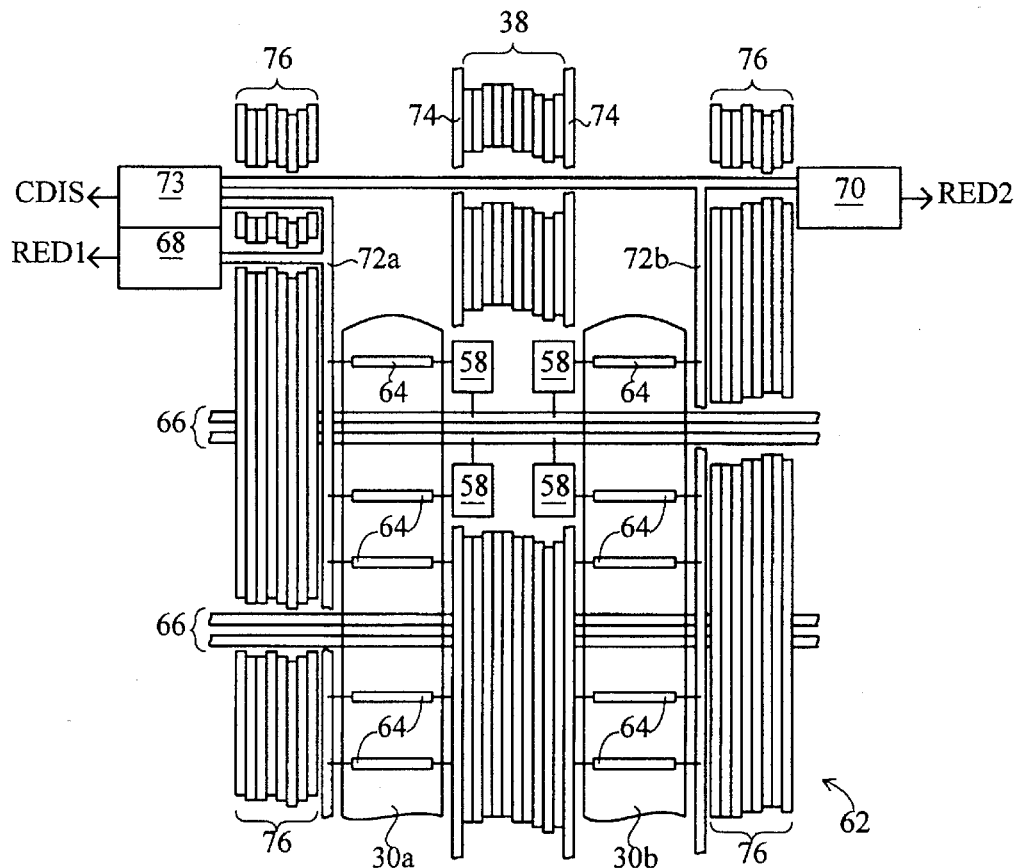
FIG. 5 is a block diagram illustrating the layout of the column redundancy circuit of a preferred embodiment of the present invention.

Referring now to FIG. 5, a block schematic diagram illustrating a column redundancy circuit 62 of a preferred embodiment is set forth. The column redundancy 62 circuit includes a number of column fuses 64, decoder interconnects 66, first column redundancy logic 68, second column redundancy logic 70, a standard column disable circuit 73, a number of fuse gates 58, and two column fuse summing nodes 72a and 72b. In a similar fashion to the row redundancy circuit 44 shown in FIG. 3, each column fuse 64 is connected by a fuse gate 58 to a column supply 74. The column supply 74 of the embodiment set forth in FIG. 5 is actually two metallization lines running parallel and adjacent to each column fuse bank 30a and 30b. The column fuses 64 of column bank 30a are also coupled to column fuse summing node 72a. In a mirror image arrangement, the column fuses of column bank 30b are all connected to column fuse summing node 72b. The decoder interconnects 66 connect the fuse gates 58 of the column redundancy circuit 62 to a number of column decoder lines 76. In the embodiment of FIG. 5, each decoder interconnect 66 connects one column decoder line 76 to one fuse gate 58 within each column fuse bank 30a and 30b. The decoder interconnects 66 extend beyond the area illustrated in FIG. 5, and provide decoder signals to a number of standard column decoders (not shown) of the RAM 10. The column fuse summing node 72a is provided as an input to both the first column redundancy logic 68 and the standard column disable circuit 73. Similarly, the column fuse summing node 72b is coupled to the column fuses 64 of column fuse bank 30b and is provided as an input to both the second column redundancy logic 70 and the standard column disable circuit 73.

While the embodiment illustrated in FIGS. 3 and 5 sets forth a row redundancy circuit 44 and column redundancy circuit 62, one skilled in the art would recognize the two redundancy circuits (44 and 62) could each use different circuit elements to accomplish the same function.

In the embodiment illustrated in FIG. 5, the column decoder lines 76 are divided into two groups, one group situated on one side of column fuse bank 30a, and a second group situated in a mirror image fashion on one side of column fuse bank 30b. The decoder interconnects 66 are connected to column lines 76 in either the first group or the second group, i.e. the entire column address is carried between the two groups combined. The row decoder lines 38, also illustrated in FIG. 3, are shown in a cut away view situated between the column fuse banks 30a and 30b, extending over the decoder interconnects 66. Referring back to FIG. 3, the second group of column decoder lines 76 are illustrated to one side of row fuse bank 28d. It is understood that the first group of column decoder lines 76 would be disposed intermediate row fuse summing node 52 and the standard row drivers 36. In this manner the row and column decoder lines (76 and 38) extend between vertically adjacent pairs of array blocks (such as 14a/14b and 14c/14d) to commonly provide row and column decode signals to the array blocks 14 contained therein. Referring once again to FIGS. 3 and 5, in a preferred embodiment the first supply 60 and the the column supply 74 are the same structure (parallel metallization lines).

Figure 6:
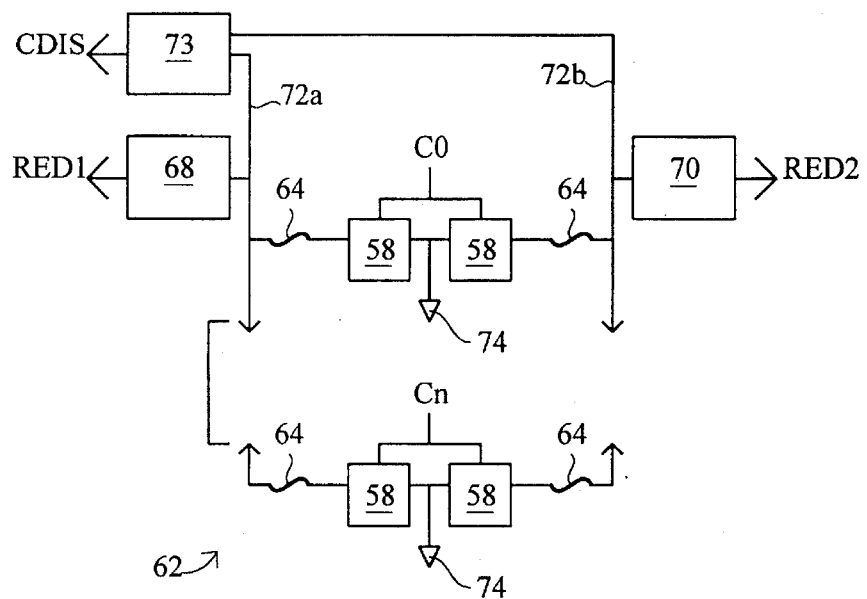
FIG. 6 is a block schematic diagram illustrating the column redundancy circuit of a preferred embodiment of the present invention.

Referring now to FIG. 6, a block schematic diagram is set forth illustrating the column redundancy circuit 62 of the embodiment set forth in FIG. 6. The column redundancy circuit 62 provides a "double" column redundancy scheme for its respective corearray 12. As mentioned above, column decoder signal (shown as C0 to Cn) is coupled to two fuse gates 58. Each fuse gates 58 is coupled to column supply 74 (shown as ground in the embodiment of FIG. 6) and a column fuse 64. In a similar fashion to the row redundancy circuit 44, the first and second column redundancy logic (68 and 70) precharge their respective summing nodes (72a and 72b) to a high logic state prior to a column access operation (such as a read or write). In the event all of the column fuses 64 are in tact both summing nodes (72a and 72b) will be pulled to ground, as for any given column address, one of the decoder signals (C0-Cn) will be active and turn on its respective pair of fuse gates 58.

To enable column redundancy, selected ones of the column fuses 64 in a single column fuse bank (30a or 30b) are opened. In a manner similar to the row redundancy scheme, if the column fuses 64 corresponding to a particular combination of column decode signals (column address) are opened, the summing node (72a or 72b) coupled to the column fuses 64 will remain precharged high. In response to a high signal at its respective summing node the column redundancy logic (68 or 70) will output a first or second redundant column active signal (shown as RED1 and RED2). The signal RED1 drives a segment of redundant columns 26. The signal RED2 drives a second, different segment of redundant columns 26.

Unlike the row redundancy circuit 44, the dual column fuse banks (30a and 30b) provide "double" redundancy. A first column address can be replaced by disabling a first combination of column fuses 64 in column fuse bank 30a, and second column address can be replaced by disabling a second, different, combination of column fuses 64 in column fuse bank 30b. The column redundancy circuit 62 also differs from the row redundancy circuit 44 in that the opening of a selected combination of column fuses 64 in either column fuse bank (30a and 30b) automatically disables the replaced, defective standard column. In the embodiment of FIGS. 5 and 6, a high signal at either fuse summing node (72a or 72b) during a column access will generate a global standard column disable signal (shown as CDIS). Accordingly, in the event either the first or second column redundant logic (68 or 70) drives a segment of redundant columns 26, all of the standard columns of the corearray 12 will be disabled.

It should be noted that the redundancy scheme set forth for the row redundancy could be used to implement column redundancy. In such an arrangement the column fuse banks would include both column disable fuses and column redundancy fuses. Laser repair would follow from the row redundancy case; i.e. a segment of standard columns would be disabled by opening a column disable fuse and be replaced by opening selected column redundancy fuses corresponding to the address of the disabled standard column segment. In such a case the column fuse banks could be parallel to the standard rows 34, with the row fuse banks 28 aligned therewith. Accordingly, the particular combination of the row redundancy circuit 44 and the column redundancy circuit 62 of the embodiments set forth herein should not be read as limiting.

As will be apparent to one skilled in the art, the invention has been described in connection with its preferred embodiments, and may be changed, and other embodiments derived, without departing from the spirit and scope of the invention.

What I claim is:

1. In a semiconductor memory device having at least one memory array block that includes a plurality of standard rows and at least one redundant row, a redundancy circuit comprising:

a redundant row decoding circuit for activating the redundant row in response to a selected row decode signal; and a row fuse bank generally perpendicular to the standard rows and proximate a first side of the memory array block, said row fuse bank including
a plurality of disable fuses, each disable fuse disabling at least one standard row, and
a plurality of redundant row decoder fuses interspersed among said disable fuses, the selected row decode signal for said redundant row decoding circuit being determined by opening selected ones of the redundant row decoder fuses.

2. The semiconductor memory device of claim 1 wherein:

said redundant row decoding circuit includes a common fuse node, the common fuse node being a conductive line situated parallel and proximate to said row fuse bank; and each redundant row decoder fuse is coupled at a first end to the common fuse node.

3. The semiconductor memory device of claim 2 further including:

a plurality of row decode lines; and said redundant row decoding circuit further includes a redundant row decode gate for each redundant row decode fuse, each redundant row decode gate coupling a second end of its respective redundant row decoder fuse to a power supply and being activated by at least one of said row decode lines.

4. The semiconductor memory device of claim 3 wherein:

said plurality of row decode lines is generally parallel and adjacent to said row fuse bank.

5. The semiconductor memory device of claim 1 wherein:
the disable fuses and redundant row decoder fuses are disposed with equal pitch within said row fuse bank.

6. The semiconductor memory device of claim 1 wherein:
the ratio of disable fuses to row redundant fuses is an integer N and for substantially the entire row fuse bank, every Nth fuse is a redundant row decoder fuse.

7. The semiconductor memory device of claim 1 wherein:
the disable fuses and redundant row decoder fuses are doped polysilicon and opened via laser evaporation.

8. The semiconductor memory device of claim 1 wherein:
the memory array further includes
the standard rows being arranged in standard row segments of M rows,
at least one redundant row segment having M redundant rows,
a standard row driver circuit adjacent to each standard row segment, each standard row driver circuit commonly driving the standard rows of the standard segment in response to a row driver signal, and
a standard row decode circuit for each standard row driver circuit, each said standard row decode circuit generating a row driver signal in response to a selected combination of row decode signals;
said row fuse block includes one disable fuse intermediate each standard row decode circuit and each standard row driver circuit, each disable fuse disabling its respective standard block when opened; and
said redundant row decoding circuit commonly drives at least one redundant row segment in response to the selected row decode signal.

9. The semiconductor memory device of claim 8 wherein:
each said standard row driver circuit is adjacent to its respective standard segment on the first side of the memory array block;
said row fuse bank is adjacent to said standard row driver circuits; and
each said row decoder circuit is adjacent to said row fuse bank.

10. A placement of circuit components on a semiconductor substrate to form a portion of a semiconductor memory, comprising:
a rectangular array of at least two array blocks, each array block including a plurality of standard rows, a plurality of standard columns, at least one redundant row, and at least one redundant column, the array blocks being arranged in at least one column of array blocks aligned in a first direction;
a redundant row decoder for each array block, each said redundant row decoder selecting at least one redundant row in its respective array block in response to a redundant row address; and
a row fuse bank for each array block, each row fuse bank including a plurality of row disable fuses and a plurality of redundant row fuses interspersed among the row disable fuses, each row disable fuse disabling at least one standard row when opened, the redundant row address being enabled by opening selected ones of the redundant row fuses; wherein
the row fuse beds of the array blocks comprising the column of array blocks are commonly aligned along a fuse axis, the fuse axis being adjacent to, and parallel with the column of array blocks.

11. The placement of circuit components of claim 10 further including:
a column fuse bank for each array block, each column fuse bank having a plurality of column fuses, the column fuse banks being commonly aligned along the fuse axis.

12. The placement of circuit components of claim 11 wherein:
said column fuse banks are intermediate row fuse banks along the fuse axis.

13. The placement of circuit components of claim 11 further including:
column decoder means for each array block, each said column decoder means selecting at least one column in response to a column decode address, each column decoder means being coupled to the column fuse bed of its respective array block, said column decoder means disabling at least one standard column and enabling at least one redundant column in response to the opening of selected ones of the column fuses.

14. The placement of circuit components of claim 10 wherein:
said rectangular array of array blocks includes a first and a second column of array blocks separated by a central area; and
the fuse banks of the array blocks of the first column of array blocks are disposed along a first fuse axis situated within the central area adjacent to the first column of array blocks, and the fuse banks of the array blocks of the second column of array blocks are disposed along a second fuse axis situated within the central area, the second fuse axis being parallel to the first fuse axis and adjacent to the second column of array blocks.

15. In a semiconductor memory device having a plurality of array blocks, each array block including a plurality of standard memory cells arranged in standard lines in a first direction, a plurality of redundant memory cells arranged in redundant lines in the first direction, and a line redundancy scheme having a plurality of disable fuses for disabling at least one standard line when a selected one of the disable fuses is opened and a plurality of redundant fuses for enabling at least one redundant line when a selected combination of redundant fuses are opened, the improvement comprising:
a first fuse bank adjacent to each array block and perpendicular to the first direction, the first fuse bank including the disable fuses and redundant fuses arranged with uniform pitch, the redundant fuses being situated with substantially regular periodicity between the disable fuses.

16. The improvement of claim 15 wherein:
the array blocks are disposed in array block pairs, aligned in the first direction forming a central area therebetween; and
said first fuse banks of each array block pair are disposed in the central area, aligned in a second direction perpendicular to the first direction.

17. The improvement of claim 16 further including:
the plurality of standard memory cells being further arranged in standard lines in the second direction and the plurality of redundant cells being further arranged in redundant lines in the second direction;
a second fuse bank for each array block commonly aligned with the first fuse bank of its respective array block, each said second fuse bank including a plurality of second fuses; and
a second redundancy scheme for disabling at least one standard lines in the second direction and enabling at least one redundant line in the second direction by opening selected ones of the second fuses.

18. The improvement of claim 17 wherein:

each array block pair includes a first array block and an opposing second array block, each array block further including a plurality of first decoder means for selecting at least one standard line in the first direction according to a first address, said first decoder means being disposed within the central area, intermediate the opposing first fuse banks of the first and second array blocks; and a plurality of first decoder lines disposed within the central area, intermediate opposing first fuse banks, said first decoder lines providing the first addresses to said first decoder means.

19. The improvement of claim 18 further including:

a plurality of second decoder means for selecting at least one standard line in the second direction according to a second address; and a plurality of second decoder lines for providing second addresses to said second decoder means, said second decoder lines being divided into a first line group and a second line group, the first line group being disposed intermediate the first array block and its associated first fuse bank, the second line group being disposed intermediate the second array block and its associated first fuse bank.

20. The improvement of claim 19 further including:

a plurality of array block pairs commonly aligned in the second direction; and said first decoder lines and said second decoder lines are common to the aligned array block pairs and provide first and second addresses thereto.

* * * * *